United States Patent
Kim et al.

(10) Patent No.: US 9,705,107 B2
(45) Date of Patent: Jul. 11, 2017

(54) ORGANIC LIGHT EMITTING DIODE DEVICE AND MANUFACTURING METHOD THEREOF

(71) Applicant: Samsung Display Co., Ltd., Yongin-si, Gyeonggi-do (KR)

(72) Inventors: Nam-Jin Kim, Yongin-si (KR); Chul-Hwan Park, Yongin-si (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/215,941

(22) Filed: Jul. 21, 2016

(65) Prior Publication Data
US 2016/0329523 A1   Nov. 10, 2016

Related U.S. Application Data

(63) Continuation of application No. 14/691,416, filed on Apr. 20, 2015, now Pat. No. 9,419,247, which is a (Continued)

(30) Foreign Application Priority Data

Feb. 7, 2013   (KR) .................. 10-2013-0013832

(51) Int. Cl.
*H01L 51/52* (2006.01)
*H01L 51/56* (2006.01)
*H01L 27/32* (2006.01)

(52) U.S. Cl.
CPC ...... *H01L 51/5256* (2013.01); *H01L 27/3246* (2013.01); *H01L 51/56* (2013.01); *H01L 51/5246* (2013.01)

(58) Field of Classification Search
CPC . H01L 51/52; H01L 51/5256; H01L 51/5253; H01L 51/524
See application file for complete search history.

(56) References Cited

U.S. PATENT DOCUMENTS 8,659,224 B1    2/2014 Moon
2003/0164674 A1  9/2003 Imamura
(Continued)

FOREIGN PATENT DOCUMENTS

CN   101320785   12/2008
CN   102683381    9/2012
(Continued)

OTHER PUBLICATIONS

Extended European Search Report dated Nov. 27, 2015 in corresponding European Patent Application No. 14152827.3.
(Continued)

*Primary Examiner* — Phuc Dang
(74) *Attorney, Agent, or Firm* — Knobbe Martens Olson & Bear LLP

(57) ABSTRACT

An organic light emitting diode device can have an enhanced thin film encapsulation layer for preventing moisture from permeating from the outside. The thin film encapsulation layer can have a multilayered structure in which one or more inorganic layers and one or more organic layers are alternately laminated. A barrier can be formed outside of a portion of the substrate on which the organic light emitting diode is formed. The organic layers of the thin film encapsulation layer can be formed inside an area defined by the barrier.

13 Claims, 5 Drawing Sheets

Related U.S. Application Data continuation of application No. 14/010,296, filed on Aug. 26, 2013, now Pat. No. 9,035,291.

(56) References Cited

U.S. PATENT DOCUMENTS

| | | |
|---|---|---|
| 2005/0277355 A1 | 12/2005 | Choi et al. |
| 2006/0012300 A1 | 1/2006 | Lan et al. |
| 2007/0102737 A1 | 5/2007 | Kashiwabara et al. |
| 2007/0159089 A1 | 7/2007 | Oh et al. |
| 2007/0159096 A1 | 7/2007 | Oh et al. |
| 2007/0194307 A1* | 8/2007 | Kim .............. H01L 27/3246 257/40 |
| 2008/0157656 A1 | 7/2008 | Liao et al. |
| 2008/0305360 A1 | 12/2008 | Han et al. |
| 2009/0302751 A1* | 12/2009 | Hanawa ........... H01L 27/3276 313/504 |
| 2010/0009531 A1 | 1/2010 | Choi et al. |
| 2010/0026167 A1 | 2/2010 | Park et al. |
| 2012/0091477 A1 | 4/2012 | Kim |
| 2012/0133275 A1* | 5/2012 | Lee .................. H01L 51/5256 313/506 |
| 2012/0235171 A1 | 9/2012 | Kim et al. |
| 2012/0319141 A1 | 12/2012 | Kim |
| 2013/0037792 A1 | 2/2013 | Kim et al. |
| 2013/0127335 A1 | 5/2013 | Chang et al. |
| 2013/0187163 A1 | 7/2013 | Kim et al. |
| 2013/0328480 A1 | 12/2013 | Joo et al. |

FOREIGN PATENT DOCUMENTS

| | | |
|---|---|---|
| KR | 2005-0117049 | 12/2005 |
| KR | 2012-0045889 | 5/2012 |
| KR | 2012-0057286 | 6/2012 |
| TW | 580843 | 1/2002 |
| TW | 200915907 | 4/2009 |

OTHER PUBLICATIONS

Office Action dated Oct. 8, 2016 in corresponding Chinese Patent Application No. 201410031207.5.

Office Action dated Feb. 14, 2017 in corresponding Taiwanese Patent Application No. 103100438.

* cited by examiner

ORGANIC LIGHT EMITTING DIODE DEVICE AND MANUFACTURING METHOD THEREOF

CROSS-REFERENCE TO RELATED APPLICATIONS

This application is a continuation of U.S. patent application Ser. No. 14/691,416, filed Apr. 20, 2015, now U.S. Pat. No. 9,419,247, issued on Aug. 16, 2016, which is a continuation of U.S. patent application Ser. No. 14/010,296, filed on Aug. 26, 2013, now U.S. Pat. No. 9,035,291, issued on May 19, 2015, which claims priority to and the benefit of Korean Patent Application No. 10-2013-0013832, filed on Feb. 7, 2013 with the Korean Intellectual Property Office, the entire contents of which are incorporated herein by reference in their entireties.

BACKGROUND

Field

The present disclosure relates to an organic light emitting diode device with an improved encapsulation structure for preventing moisture from permeating from the outside, and a manufacturing method thereof.

Description of the Related Technology

An organic light emitting diode device has a characteristic in which an organic light emitting diode unit is deteriorated due to permeation of oxygen or moisture. Accordingly, in order to prevent oxygen or moisture from permeating from the outside, an encapsulation structure for sealing and protecting the organic light emitting diode unit is typically used.

As an encapsulation structure, a thin film encapsulation structure which covers the organic light emitting diode unit by a multilayer structure in which organic layers and inorganic layers are alternately laminated has been widely adopted. The organic light emitting diode unit is sealed by alternately laminating the organic and inorganic layers on the organic light emitting diode unit of a substrate.

The organic layer serves to give flexibility to a flat panel display, and the inorganic layer serves to prevent oxygen or moisture from permeating. Accordingly, in order to prevent oxygen or moisture from permeating from the outside, the organic layers are positioned inside adjacent to the organic light emitting diode unit, and the inorganic layers are positioned outside the organic light emitting diode unit.

However, the organic layer is formed by curing monomers due to exposure to ultraviolet light or the like after depositing the monomers, and in order to deposit the monomers, generally, a flash evaporation method has been used. When the evaporated monomers are deposited, some of the monomers flow into a lower part of a mask and thus may be deposited in a region where deposition is not desired. Since the deposited region is a region where only the inorganic layer is desired, when the organic layer exists in the region, adhesion is decreased and thus a releasing problem may occur, and further, permeation of moisture and oxygen from the outside may be caused and thus a dark-dotted defect may occur.

SUMMARY OF CERTAIN INVENTIVE ASPECTS

The present disclosure has been made in an effort to provide an organic light emitting diode device including a thin film encapsulation layer having enhanced adhesion and preventing moisture and oxygen from permeating from the outside by forming a barrier which prevents monomers from flowing into a lower part of a mask such that deposition is performed only in a region requiring deposition, and a manufacturing method thereof.

One embodiment of the present disclosure provides an organic light emitting diode device, including: a substrate; an organic light emitting diode unit formed on a portion of the substrate; and a thin film encapsulation layer formed to cover the organic light emitting diode unit, in which the thin film encapsulation layer has a multilayered structure in which one or more inorganic layers and one or more organic layers are alternately laminated, a barrier is formed outside the organic light emitting diode unit on the portion of the substrate, and the organic layers of the thin film encapsulation layer are formed inside an area defined the barrier.

The organic light emitting diode unit may include a first electrode, an organic emission layer, and a second electrode which are sequentially formed over the portion of the substrate.

A number of the inorganic layers and the organic layers may be between 2 to 20 layers, respectively.

A height of the barrier may be equal to, lower than a height of the organic layer of the one or more organic layers of the thin film encapsulation layer located furthest from the organic light emitting diode unit.

A material forming the barrier may be an organic material or an inorganic material, and in detail, may be an organic material including one or more of: a photoresist, a polyacrylic resin, a polyimide resin, or an acrylic resin, or an inorganic material including a silicon compound.

Another embodiment of the present disclosure provides a manufacturing method of an organic light emitting diode device, the method including: preparing a substrate; forming an organic light emitting diode unit on a portion of the substrate; forming a barrier spaced apart from the organic light emitting diode uniton the portion of the substrate; and forming a thin film encapsulation layer so as to cover the organic light emitting diode unit, in which forming the thin film encapsulation layer includes forming a plurality of inorganic layers inside an area defined by the barrier.

The forming of the organic light emitting diode unit may include forming an insulating layer on the portion of the substrate; forming a pattern of a first electrode on the insulating layer; forming a pixel defining layer so that the first patterned electrode is partitioned by a pixel unit, forming an organic emission layer on the first electrode; and forming a second electrode on the organic emission layer, in which forming the barrier may be performed simultaneously with forming the pixel defining layer.

Forming the plurality of inorganic layers and forming the plurality of organic layers may be alternately performed 2 to 20 times, respectively.

A height of the barrier may be equal to or lower than a height of the inorganic layer of the plurality of inorganic layers located furthest away from the organic light emitting diode unit.

A material forming the barrier may be an organic material or an inorganic material, and in detail, may be an organic material including at least one of: a photoresist, a polyacrylic resin, a polyimide resin, or an acrylic resin, or an inorganic material including a silicon compound.

In the organic light emitting diode device according to embodiments of the present disclosure, since deposition is performed only in a region requiring deposition by forming a barrier to prevent monomers from flowing into a lower part of a mask, it is possible to improve adhesion and prevent moisture and oxygen from permeating from the outside.

Further, since a dead space is decreased and improved during a product design by performing the deposition only in a region requiring deposition, it is advantageous to reinforce product competitiveness.

Furthermore, since the barrier according to the present disclosure may be formed by the same material and the same mask as those used when the pixel defining layer is formed, an additional process and an additional material are not be required.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION OF CERTAIN INVENTIVE EMBODIMENTS

Figure 1:
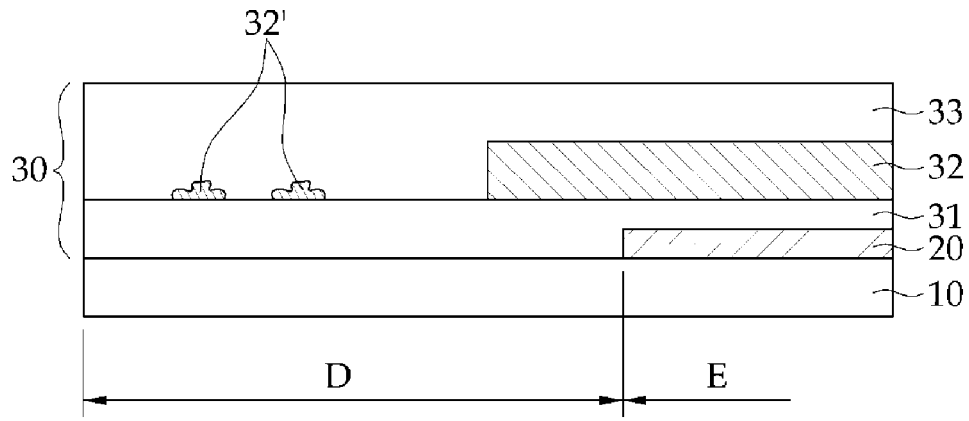
FIG. 1 is a cross-sectional view schematically illustrating a structure of an organic light emitting diode device.

Hereinafter, certain embodiments of the present disclosure will be described in detail with reference to the accompanying drawings.

Although the present disclosure can be modified and implemented by several embodiments, specific embodiments are illustrated in the accompanying drawings and will be mainly described in the specification. However, the scope of the present disclosure is not limited to the specific embodiments, and it should be understood that all the changes, equivalents, and substitutions included in the spirit and scope of the present disclosure are included in the scope of the present disclosure.

Terms used in the present disclosure are selected from normal terms which are widely used presently, but in some cases, a term which is arbitrarily selected by an applicant exists, and in this case, a meaning thereof should be understood by considering the meaning disclosed or used in the description of the present disclosure.

Parts which are not associated with the description are omitted in order to specifically describe the present disclosure and like reference numerals generally refer to like elements throughout the specification. Further, in the drawings, a size, and a thickness of each element are arbitrarily illustrated for convenience of description, and the present disclosure is not necessarily limited to those illustrated in the drawings.

In the drawings, the thicknesses of layers and regions are enlarged for clarity. In the drawings, the thicknesses of some layers and regions may be exaggerated for convenience of description. It will be understood that when an element such as a layer, film, region, or substrate is referred to as being "on" another element, it can be directly on the other element or intervening elements may also be present.

FIG. 1 is a cross-sectional view schematically illustrating a structure of an organic light emitting diode device.

As illustrated in FIG. 1, an organic light emitting diode device includes a substrate 10; an organic light emitting diode unit 20 formed on the substrate; and a thin film encapsulation layer 30 formed to cover the organic light emitting diode unit.

Figure 2:
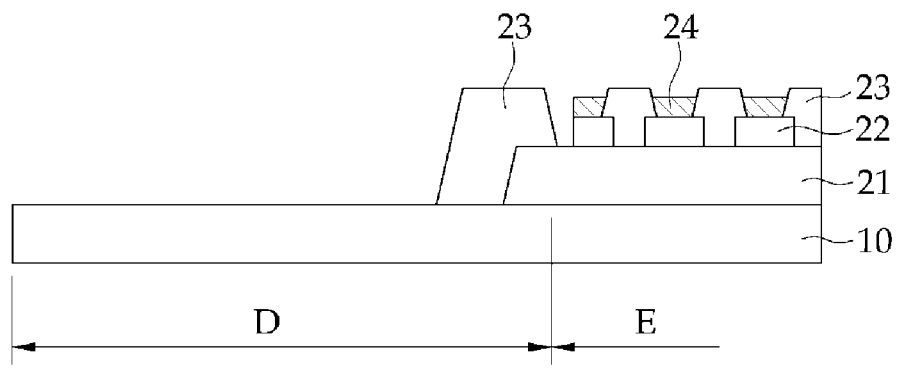
FIG. 2 is a cross-sectional view illustrating an organic light emitting diode unit of the organic light emitting diode device.
Figure 3:
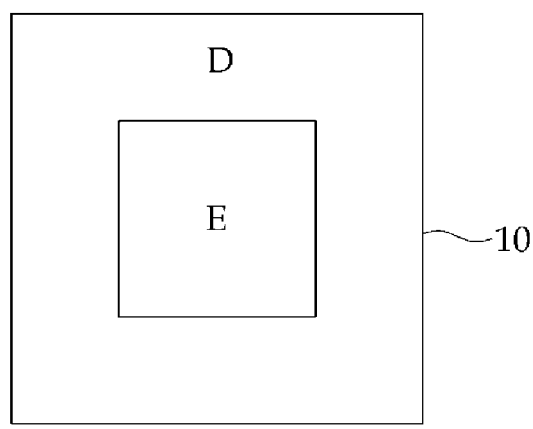
FIG. 3 is a schematic diagram for describing a structure of an emission space and a dead space in the organic light emitting diode device.

As illustrated in FIG. 2, the organic light emitting diode unit 20 has a structure in which an insulating layer 21, a first electrode 22, a pixel defining layer 23, an emission layer 24, and a second electrode (not illustrated) are sequentially formed on the substrate 10. Further, the organic light emitting diode device may be divided into an emission space E and a dead space D, as briefly illustrated in FIG. 3.

Referring back to FIG. 1, the thin film encapsulation layer 30 has a structure in which inorganic layers 31 and 33 and an organic layer 32 are alternately laminated.

The organic layer 32 mainly serves to give flexibility to a flat panel display, and the inorganic layers 31 and 33 serve to prevent oxygen or moisture from permeating therein. Accordingly, in order to prevent oxygen or moisture from permeating from the outside, the organic layer 32 is positioned at the inside adjacent to the organic light emitting diode unit, and the inorganic layers 31 and 33 are positioned outside the organic light emitting diode unit.

However, the organic layer 32 is formed by curing monomers by exposure to ultraviolet light or the like after depositing the monomers, and in order to deposit the monomers, generally, a flash evaporation method has been used. When the evaporated monomers are deposited, some of the monomers flow into a lower part of a mask and thus some of the monomers 32' may be deposited in a region where the deposition is not desired. Since the deposited region is a region where only the inorganic layers 31 and 33 are desired, when the organic layer 32 exists in the region, adhesion is decreased and thus a releasing problem may occur, and further, permeation of moisture and oxygen from the outside may be caused and thus a dark-dotted defect may occur.

In order to address these problems, the present disclosure provides an organic light emitting diode device including a thin film encapsulation layer having enhanced adhesion and preventing moisture and oxygen from permeating from the outside by forming a barrier which prevents monomers from flowing into a lower part of a mask such that deposition is performed only in a region requiring deposition, and a manufacturing method thereof.

Figure 4:
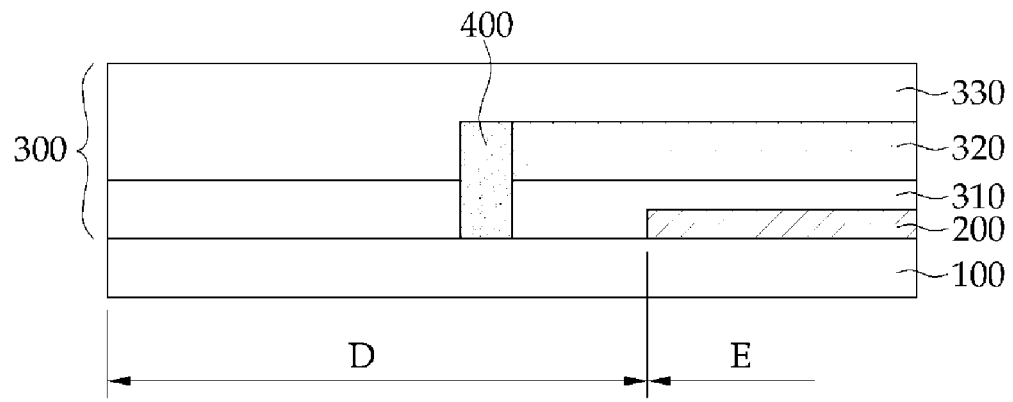
FIG. 4 is a cross-sectional view schematically illustrating a structure of the organic light emitting diode device according to an embodiment of the present disclosure.

FIG. 4 is a cross-sectional view schematically illustrating an organic light emitting diode device according to an embodiment of the present disclosure.

As illustrated in FIG. 4, an organic light emitting diode device according to an embodiment of the present disclosure includes a substrate 100; an organic light emitting diode unit 200 formed on the substrate; and a thin film encapsulation layer 300 formed to cover the organic light emitting diode unit, in which the thin film encapsulation layer 300 has a multilayer structure in which one or more inorganic layers 310 and 330 and at least one organic layer 320 are alternately laminated. The organic light emitting diode device also includes a barrier 400 formed to be spaced apart from the organic light emitting diode unit 200, outside the organic light emitting diode unit 200 on the substrate 100, and the organic layer 320 of the thin film encapsulation layer 300 is formed inside the barrier 400.

The substrate 100 may be a glass substrate or a transparent plastic substrate which has excellent mechanical strength, thermal stability, transparency, surface smoothness, handleability, and water repellency. Although not illustrated in FIG. 4, the substrate 100 may be variously modified, and for example, a planarization layer, an insulating layer, and the like may be further provided on the substrate 100.

Figure 5:
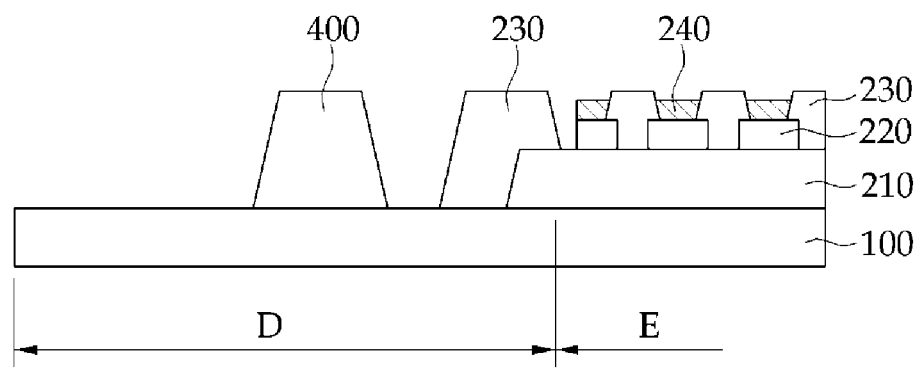
FIG. 5 is a cross-sectional view illustrating an organic light emitting diode unit of the organic light emitting diode device according to the embodiment of the present disclosure.

Referring to FIG. 5, the organic light emitting diode unit 200 is provided on the substrate 100. The organic light emitting diode unit 200 includes an insulating layer 210, a first electrode 220, a pixel defining layer 230, an organic emission layer 240, and a second electrode (not illustrated) which are sequentially formed.

Further, in FIG. 5, for simplifying the description, a semiconductor device is not separately illustrated but omitted, but the semiconductor device may be disposed between the substrate 100 and the insulating layer 220. An example of the semiconductor device includes a thin film transistor (TFT) including a gate electrode, a source electrode, and a drain electrode.

In the case where the first electrode is a positive electrode, the first electrode 220 may be electrically connected with the drain electrode of the thin film transistor (TFT). The semiconductor device may be formed by a general method of forming the thin film transistor. Accordingly, the description for a detailed method of forming the semiconductor device or the thin film transistor is omitted.

As illustrated in FIG. 5, the insulating layer 210 is disposed on the substrate 100.

In the case where lower structures including a switching element, a contact, a pad, a plug, an electrode, a conductive pattern, an insulation pattern, and the like are provided on the substrate, the insulating layer 210 may have a thickness sufficient enough to cover the lower structures.

The insulating layer 210 may be formed in a single structure, but may be formed in a multilayer structure including two or more insulating layers.

In order to improve the degree of planarization of the insulating layer 210 formed on the substrate, a planarization process may be performed on the substrate. For example, the substrate may have a flat upper surface by applying a chemical mechanical polishing (CMP) process, an etch-back process, and the like onto the substrate.

According to an embodiment of the present disclosure, the insulating layer 210 may contain an organic material. For example, the insulating layer 210 may contain a material selected from a photoresist, an acrylic polymer, a polyimide polymer, a polyamide polymer, a siloxane polymer, a polymer containing a photosensitive acryl carboxyl group, a novolac resin, or an alkali developable resin. These materials may be used either alone or in combination thereof.

According to another embodiment of the present disclosure, the insulating layer may be formed by using an inorganic material such as a silicon compound, metal, or metal oxide. For example, the insulating layer 210 may contain a material selected from silicon oxide (SiOx), silicon nitride (SiNx), silicon oxynitride (SiOxNy), silicon oxycarbide (SiOxCy), silicon carbonitride (SiCxNy), aluminum (Al), magnesium (Mg), zinc (Zn), hafnium (Hf), zirconium (Zr), titanium (Ti), tantalum (Ta), aluminum oxide (AlOx), titanium oxide (TiOx), tantalum oxide (TaOx), magnesium oxide (MgOx), zinc oxide (ZnOx), hafnium oxide (HfOx), zirconium oxide (ZrOx), and titanium oxide (TiOx). These materials may be used either alone or in combination thereof.

The insulating layer 210 may be formed on the substrate by using a spin coating process, a printing process, a sputtering process, a chemical vapor deposition (CVD) process, an atomic layer deposition (ALD) process, a plasma enhanced chemical vapor deposition (PECVD) process, a high density plasma-chemical vapor deposition (HDP-CVD) process, a vacuum deposition process, and the like, according to a constituent material.

The first electrode is formed on the insulating layer 210. The first electrode 220 may be formed by using a vacuum deposition method, a sputtering method, or the like, and may be a cathode or an anode. The first electrode 220 may be a transparent electrode, a transluscent electrode, or a reflective electrode and may be formed by using indium tin oxide (ITO), zinc indium oxide (IZO), tin oxide ($SnO_2$), zinc oxide (ZnO), Al, Ag, Mg and the like, but is not limited thereto. Further, the first electrode 220 may be variously modified, and for example, may have a structure having two or more layers by using two or more different materials.

Next, the pixel defining layer 230 is formed on the insulating layer 210 and the first electrode 220. The pixel defining layer 230 may be formed by using an organic material, an inorganic material, and the like. For example, the pixel defining layer 230 may contain a material selected from an organic material such as photoresist, a polyacryl-based resin, a polyimide-based resin, and an acryl-based resin, or an inorganic material such as a silicon compound.

The second electrode (not illustrated) may be formed by using a vacuum deposition method, a sputtering method, or the like, and may be a cathode or an anode. Metal for forming the second electrode may use metal having a low work function, an alloy, an electrically conductive compound, and a mixture thereof. A detailed example of the metal may include lithium (Li), magnesium (Mg), aluminum (Al), aluminum-lithium (Al—Li), calcium (Ca), magnesium-indium (Mg—In), magnesium-silver (Mg—Ag) and the like. Further, the second electrode may be variously modified, and for example, may have a structure having two or more layers by using two or more different materials.

The organic emission layer 240 is provided between the first electrode 210 and the second electrode (not illustrated). The organic emission layer 240 may include a known light emitting material. For example, the light emitting material may contain a known host such as $Alq_3$, 4,4'-N,N'-dicarbazole-biphenyl (CBP), poly(n-vinylcarbazole) (PVK), and distyrylarylene (DSA), and a known dopant such as a red dopant, such as PtOEP, $Ir(piq)_3$, $Btp_2Ir(acac)$, and DCJTB, a green dopant, such as $Ir(ppy)_3$ (ppy=phenylperidine), Ir(ppy)$_2$(acac), and Ir(mpyp)$_3$, a blue dopant, such as F$_2$Irpic, (F$_2$ppy)$_2$Ir(tmd), Ir(dfppz)$_3$, and ter-fluorene, but is not limited thereto.

Meanwhile, although not illustrated in detail in FIG. 5, one or more layers selected from a hole injection layer, a hole transport layer, a hole stop layer, an electron transport layer and an electron injection layer in addition to the organic emission layer 240 may be further included between the first electrode 210 and the second electrode. The hole injection layer, the hole transport layer, the electron transport layer and the electron injection layer may be formed by using known materials and known methods.

Referring to FIG. 4, the thin film encapsulation layer 300 is provided to cover the organic light emitting diode unit 200 and includes a first inorganic layer 310, a first organic layer 320, and a second inorganic layer 330.

The thin film encapsulation layer 300 may be formed in a multilayer structure in which the inorganic layers and the organic layers are alternately laminated with 2 to 20 layers, respectively, but the respective numbers of organic layers and inorganic layers are not limited thereto.

Referring to FIGS. 4 and 5, the barrier 400 is formed to be spaced apart from the organic light emitting diode unit 200, outside the organic light emitting diode unit 200 on the substrate 100.

The barrier 400 is spaced apart from the organic light emitting diode unit 200 to be formed in the dead space D, and the organic layer 320 of the thin film encapsulation layer 300 is formed inside the barrier so that the monomers for forming the organic layer may be deposited only in a desired place.

The barrier 400 is formed when the pixel defining layer 230 is formed. Accordingly, an additional manufacturing of a separate mask is not required, and a material for forming the barrier 400 may be the same as the material for forming the pixel defining layer 230. The material for forming the barrier 400 may contain a material selected from an organic material such as a photoresist, a polyacryl-based resin, a polyimide-based resin, and an acryl-based resin or an inorganic material such as a silicon compound.

According to the present disclosure, the barrier 400 may be formed without any specific limit on a position, a shape, a size, and a number.

The barrier 400 may be disposed at any position in the dead space D, but may be positioned near the emission space E in order to improve the dead space D. Further, the shape of the barrier 400 may be formed in a desired shape such as a quadrangle, a circle, a triangle, and the like.

With respect to the size of the barrier 400, a height may be a thin film thickness or less because of being influenced by a thickness of the thin film, and a width may be a width of the dead space D or less because of being influenced by the dead space D.

According to an embodiment of the present disclosure, the height of the barrier 400 may be equal to, lower than, or higher than a height of a top organic layer of the thin film encapsulation layer 300. Further, according to another embodiment, the height of the barrier 400 may be equal to or lower than a height of a top inorganic layer of the thin film encapsulation layer 300.

Further, the barrier 400 may be formed at four sides, two sides, or a desired position, because the barrier 400 is formed only by performing patterning on a pixel defining layer mask in a desired shape.

Figure 6:
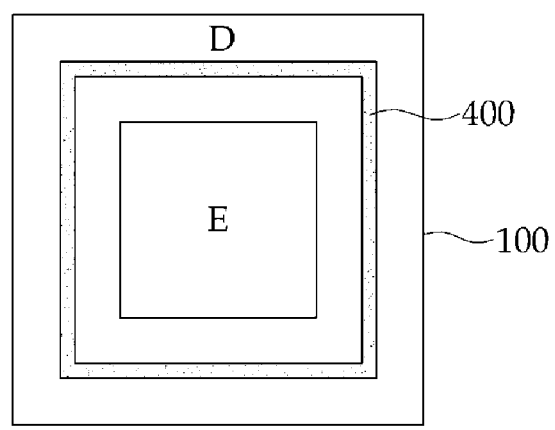
FIG. 6 is a schematic diagram for describing a shape of a barrier according to the embodiment of the present disclosure.

FIGS. 4 and 5 correspond to an example of a structure in which a single barrier 400 is formed in the dead space D and have a structure in which the barrier 400 is formed as the single barrier 400 at four sides, as illustrated in FIG. 6. In FIG. 4, the inorganic layers and the organic layer are alternately laminated one by one, but the number of inorganic layers and organic layers may be in plural. The height of the barrier 400 is controlled according to the number of layers.

Figure 7:
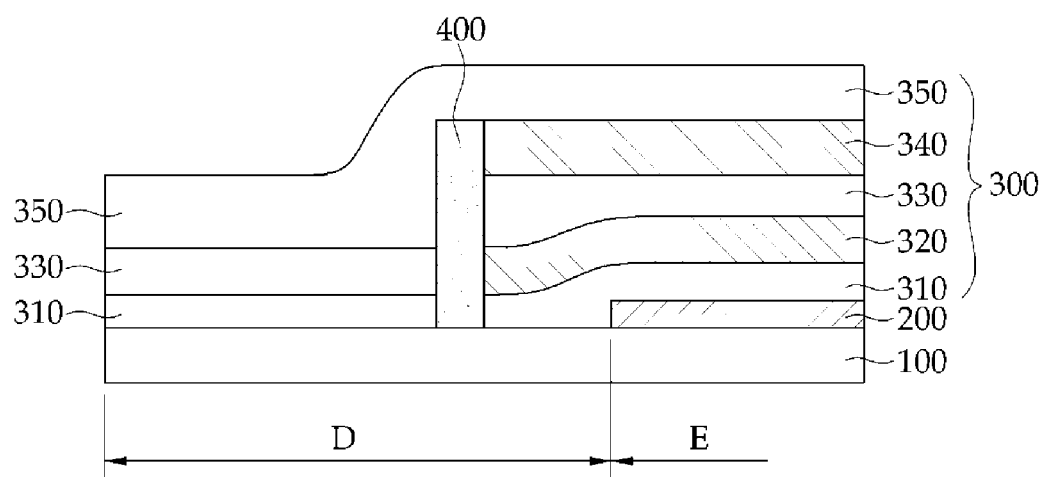
FIG. 7 is a schematic diagram for describing an organic light emitting diode device according to another embodiment of the present disclosure.

As described above, examples of the thin film encapsulation layer formed by alternately laminating the organic layers and the inorganic layers with several layers and the barrier of which the height is controlled according to the number of layers are illustrated in FIG. 7.

The encapsulation layer 300 of the organic light emitting diode device illustrated in FIG. 7 includes a first inorganic layer 310, a first organic layer 320, a second inorganic layer 330, a second organic layer 340, and a third inorganic layer 350. In FIG. 7, the encapsulation layer 300 including the three inorganic layers and the two organic layers is illustrated as an example, but the organic light emitting diode device according to the present disclosure may include an encapsulation layer in which organic layers and inorganic layers are alternately laminated with more or fewer layers.

In FIG. 7, a first organic material forming the first organic layer 320 and a second organic material forming the second organic layer 340 may be the same as or different from each other. For convenience of description, herein, the first organic material forming the first organic layer 320 is described as an example, but other organic layers forming the encapsulation layer 300 may be made of the following arranged organic materials.

The first organic material forming the first organic layer 320 may include one or more materials selected from a group consisting of an acrylic resin, a methacrylic resin, polyisoprene, a vinyl resin, an epoxy resin, a urethane resin, a cellulose resin, a perylene resin, and other polymer materials.

An example of the acrylic resin includes butyl acrylate, ethylhexyl acrylate or the like, an example of the methacrylic resin includes propylene glycol methacrylate, tetrahydroperfuryl methacrylate or the like, an example of the vinyl resin includes vinylacetate, N-vinylpyrrolidone or the like, an example of the epoxy resin includes cycloaliphatic epoxide, epoxy acrylate, vinyl epoxy-based resin or the like, an example of the urethane resin includes urethane acrylate or the like, and an example of the cellulose resin includes cellulose nitrate or the like, but the present disclosure is not limited thereto.

Similarly, a first inorganic material forming the first inorganic layer 310, a second inorganic material forming the second inorganic layer 330, and a third inorganic material forming the third inorganic layer 350 may be the same as or different from each other. For convenience of description, the inorganic material forming the first inorganic layer 310 is described as an example, but other inorganic layers forming the encapsulation layer 300 may be made of the following arranged inorganic materials.

The first inorganic material forming the first inorganic layer 310 may be one or more materials selected from a group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

Figure 8:
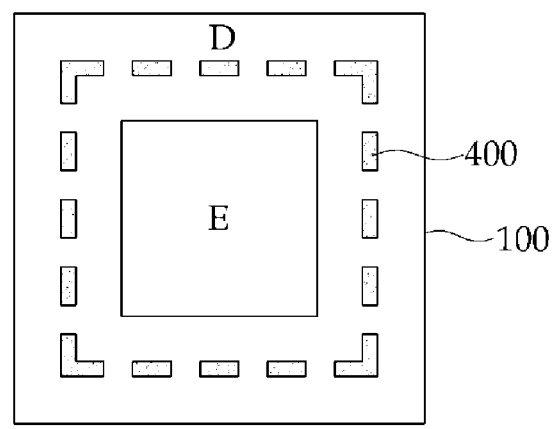
FIG. 8 is a schematic diagram for describing a shape of a barrier according to another embodiment of the present disclosure.

FIG. 8 illustrates another embodiment of the present disclosure in which the barrier 400 has a dotted-line shape. As illustrated in FIGS. 4 and 5, the barrier is formed by a single barrier on four sides, and an example of a structure formed in a dotted-line shape is illustrated in FIG. 8.

In FIGS. 6 and 8, examples, in which the barriers 400 are formed as single barriers having a straight line shape and a dotted-line shape, respectively, are illustrated, but as described above, the shape of the barrier 400 may be formed in various shapes such as a circle, a quadrangle, a triangle, and the like.

Figure 9:
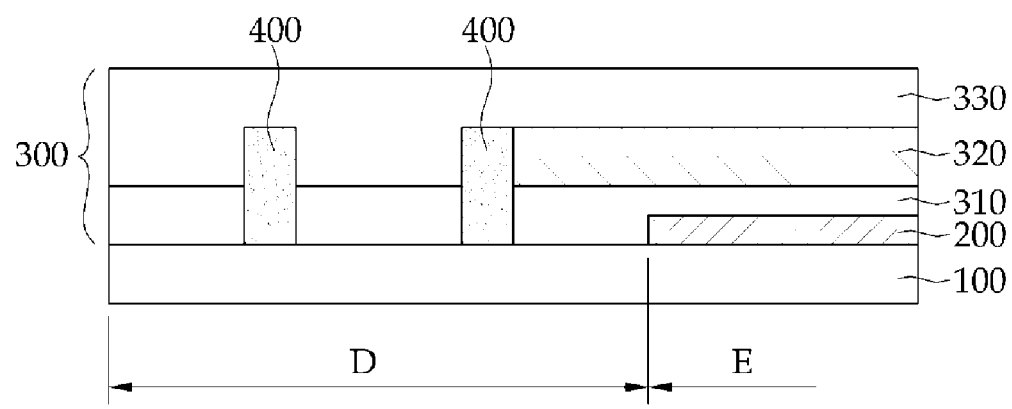
FIG. 9 is a cross-sectional view schematically illustrating a structure of the organic light emitting diode device according to yet another embodiment of the present disclosure.

FIG. 9 schematically illustrates a structure of the organic light emitting diode device according to yet another embodiment of the present disclosure, in which the number of barriers 400 is two.

As illustrated in FIG. 9, two barriers 400 may be formed. The two barriers are formed when the organic light emitting diode unit 200 is formed when the pixel defining layer 230 is formed. Thereafter, the first inorganic layer 310 of the thin film encapsulation layer 300 is formed to cover the organic light emitting diode unit 200, and the first inorganic layer 310 is deposited throughout the upper side of the substrate 100 except for the barriers 400. Next, the first organic layer 320 is formed inside one of the two barriers formed closer to the emission space E, and the second inorganic layer 330 is formed to cover the first organic layer 320 and the two barriers 400.

Figure 10:
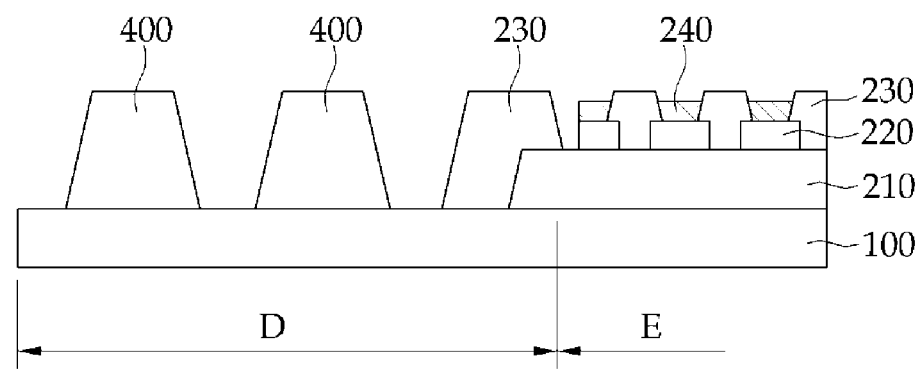
FIG. 10 is a cross-sectional view illustrating an organic light emitting diode unit of the organic light emitting diode device according to yet another embodiment of the present disclosure.
Figure 11:
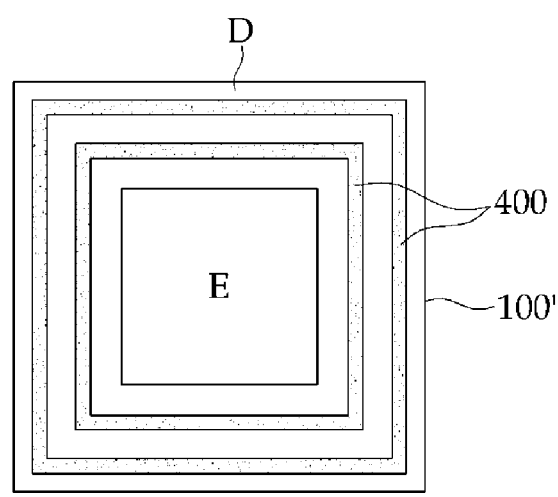
FIG. 11 is a schematic diagram for describing a shape of a barrier according to yet another embodiment of the present disclosure.

As illustrated in FIGS. 10 and 11, the organic light emitting diode device according to yet another embodiment of the present disclosure includes the two barriers 400 formed in the dead space D. Two barriers are illustrated as an example, but the number of barriers is not particularly limited, and can be within a range which does not exceed a width of the dead space D.

The double barriers 400 illustrated in FIG. 11 are formed in a straight line shape, but the double barriers may have a dotted line shape as illustrated in FIG. 8 and may be formed in various shapes such as a circle, a triangle, and the like.

An embodiment of a manufacturing method of the organic light emitting diode device according to the present disclosure includes preparing a substrate; forming an organic light emitting diode unit on the substrate; forming a barrier so as to be spaced apart from the diode unit, outside the organic light emitting diode unit on the substrate; and forming a thin film encapsulation layer so as to cover the organic light emitting diode unit, in which the forming of the thin film encapsulation layer includes forming inorganic layers; and forming organic layers, and in the forming of the organic layers, the organic layers are formed inside the barrier.

The manufacturing method of the organic light emitting diode device according to an embodiment of the present disclosure will be described below in more detail with reference to FIGS. 4 and 5.

First, the organic light emitting diode unit 200 is formed on the substrate 100.

The forming of the organic light emitting diode unit 200 includes forming an insulating layer 210 on the substrate 100; forming a pattern of a first electrode 220 on the insulating layer; forming a pixel defining layer 230 so that the first patterned electrode is partitioned by a pixel unit; forming an organic emission layer 240 on the first electrode partitioned by the pixel unit; and forming a second electrode (not illustrated) on the organic emission layer.

A method of forming the first electrode 220, the organic emission layer 240 and the second electrode (not illustrated) of the organic light emitting diode unit 200 may be performed, for example, by using deposition, sputtering, and coating methods. One or more of a hole injection layer, a hole transport layer, an electron transport layer and an electron injection layer may be formed in addition to the organic emission layer 240 between the first electrode 210 and the second electrode (not illustrated).

According to the present disclosure, the forming of the barrier 400 is performed simultaneously with the forming of the pixel defining layer 230.

The barrier 400 may be formed without requiring an additional manufacturing process of a separate mask, and this is because the barrier 400 is formed by adding patterning for the barrier in the dead space when the mask for forming the pixel defining layer is manufactured.

The barrier 400 may be formed by using the same material as the material for forming the pixel defining layer 230. The material for forming the barrier 400 may contain a material selected from an organic material such as a photoresist, a polyacryl-based resin, a polyimide-based resin, and an acryl-based resin, or an inorganic material such as a silicon compound.

The barrier 400 may be formed without any specific limit on a position, a shape, a size, and a number. The barrier 400 may be disposed at any position in the dead space D, but may be positioned near the emission space E in order to improve the dead space D. Further, the shape of the barrier 400 may be formed in a desired shape such as a quadrangle, a circle, a triangle, and the like.

With respect to the size of the barrier 400, a height may be a thin film thickness or less because of being influenced by a thickness of the thin film, and a width may be a width of the dead space D or less because of being influenced by the dead space D.

According to an embodiment of the present disclosure, the height of the barrier 400 may be equal to, lower than, or higher than a height of a top organic layer of the thin film encapsulation layer 300. Further, according to another embodiment, the height of the barrier 400 may be equal to or lower than a height of a top inorganic layer of the thin film encapsulation layer 300.

After forming the organic light emitting diode unit 200 on the substrate 100, the thin film encapsulation layer 300 is formed so as to cover the organic light emitting diode unit 200. The forming of the thin film encapsulation layer 300 includes forming inorganic layers; and forming organic layers, and a thin film encapsulation layer having a multi-layered structure may be formed by alternately performing the forming of the inorganic and organic layers 2 to 20 times.

As illustrated in FIG. 4, a first inorganic layer 310 is formed so as to cover the organic light emitting diode unit 200 on the substrate 100 with the organic light emitting diode unit 200. The first inorganic layer 310 is formed by performing deposition throughout the substrate 100 except for the position of the barrier 400.

A material forming the first inorganic layer 310 may be one or more materials selected from a group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

Thereafter, a first organic layer 320 and a second inorganic layer 330 are sequentially formed on the first inorganic layer 310.

A material forming the first organic layer 320 may include one or more materials selected from a group consisting of an acrylic resin, a methacrylic resin, polyisoprene, a vinyl resin, an epoxy resin, a urethane resin, a cellulose resin, a perylene resin, and other polymer materials.

An example of the acrylic resin includes butyl acrylate, ethylhexyl acrylate or the like, an example of the methacrylic resin includes propylene glycol methacrylate, tetrahydroperfuryl methacrylate or the like, an example of the vinyl resin includes vinylacetate, N-vinylpyrrolidone or the like, an example of the epoxy resin includes cycloaliphatic epoxide, epoxy acrylate, vinyl epoxy-based resin or the like, an example of the urethane resin includes urethane acrylate or the like, and an example of the cellulose resin includes cellulose nitrate or the like, but the material forming the first organic layer 320 is not limited thereto.

The organic layer 320 is formed by depositing monomers and formed at the inside based on the barrier 400. As such, the organic layer is formed by depositing the monomers only at a portion requiring deposition by the barrier 400, and as a result, it is possible to prevent problems in that the monomers flow into the region where the inorganic layers are formed to deteriorate adhesion and cause a dark-dotted defect.

The material and the method of forming the second inorganic layer 330 may be applied equally to those of the first inorganic layer 310 described above and refer to those described above.

In FIG. 4, an example of additionally forming the first organic layer 320 and the second inorganic layer 330 on the first inorganic layer 310 is illustrated, but the forming of the inorganic layers and the forming of the organic layers are alternately performed 2 to 20 times to form a thin film encapsulation layer laminated with multilayered organic and inorganic layers.

As described above, examples of the thin film encapsulation layer 300 formed by alternately repeating the forming of the inorganic layers and the forming of the organic layers several times and the barrier 400 formed by controlling a height according to the thin film encapsulation layer are illustrated in FIG. 7.

The encapsulation layer 300 of the organic light emitting diode device illustrated in FIG. 7 includes a first inorganic layer 310, a first organic layer 320, a second inorganic layer 330, a second organic layer 340, and a third inorganic layer 350. Further, the barrier 400 of the organic light emitting diode device illustrated in FIG. 7 may be formed to be controlled to have the same height as the second organic layer 340.

In FIG. 7, the encapsulation layer 300 including the three inorganic layers and the two organic layers is illustrated as an example, but the organic light emitting diode device according to the present disclosure may include an encapsulation layer in which organic layers and inorganic layers are alternately laminated with more or fewer layers. Further, the height of the barrier 400 may be equal to or lower than the height of the third inorganic layer 350 which is a top inorganic layer of the thin film encapsulation layer 300, and may be equal to or higher than the height of the second organic layer 340 which is a top organic layer of the thin film encapsulation layer 300.

As described above, the organic light emitting diode device according to the present disclosure includes the barrier formed simultaneously in the forming of the pixel defining layer, and as a result, it is possible to improve adhesion and prevent moisture and oxygen from permeating from the outside without an additional separate cost caused by adding a process, a mask, and a material.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An organic light emitting diode device, comprising:
a substrate including an emission space and a dead space;
an organic light emitting diode unit on the substrate in the emission space;
a first barrier formed outside of the organic light emitting diode unit in the dead space of the substrate;
a second barrier formed outside of the first barrier in the dead space of the substrate; and
a thin film encapsulation layer formed to cover the organic light emitting diode unit,
wherein the thin film encapsulation layer has a multilayered structure in which one or more inorganic layers and one or more organic layers are alternately formed,
wherein the first inorganic layer is formed on at least one of the first barrier and the second barrier.

2. The organic light emitting diode device of claim 1, wherein the first inorganic layer formed on the first barrier and the second barrier.

3. The organic light emitting diode device of claim 1, wherein the thin film encapsulation layer includes an organic layer formed inside of the second barrier on the first inorganic layer.

4. The organic light emitting diode device of claim 3, wherein the organic layer formed inside of the first barrier on the first inorganic layer.

5. The organic light emitting diode device of claim 3, wherein the thin film encapsulation layer comprises a second inorganic layer formed on the organic layer, the first barrier, and the second barrier.

6. The organic light emitting diode device of claim 5, wherein the first inorganic layer and the second inorganic layer are formed on the second barrier while in direct contact with one another.

7. An organic light emitting diode device, comprising:
a substrate;
an organic light emitting diode unit on the substrate;
a first barrier formed outside of the organic light emitting diode unit and contacting the substrate;
a second barrier formed outside of the first barrier and contacting the substrate; and
a thin film encapsulation layer formed to cover the organic light emitting diode unit,
wherein the thin film encapsulation layer has a multilayered structure in which one or more inorganic layers and one or more organic layers are alternately laminated,
wherein the first inorganic layer formed on the first barrier and the second barrier,
wherein the thin film encapsulation layer includes an organic layer formed inside of the second barrier on the first inorganic layer,
wherein the thin film encapsulation layer comprises a second inorganic layer formed on the organic layer, the first barrier, and the second barrier.

8. A method of manufacturing an organic light emitting diode device, the method comprising:
forming an organic light emitting diode unit on a substrate in an emission space; and
forming a thin film encapsulation layer so as to cover the organic light emitting diode unit,
wherein the forming of the organic light emitting diode unit comprises:
forming an inorganic insulating layer on the substrate;
forming a first electrode on the inorganic insulating layer;

forming a pixel defining layer configured to partition the first electrode on a pixel by pixel basis on the inorganic insulating layer on which the first electrode is formed;
forming a first barrier spaced apart from the first electrode in a dead space;
forming a second barrier outside of the first barrier in the emission space;
forming an organic light emitting layer on the first electrode partitioned on the pixel by pixel basis; and
forming a second electrode on the organic light emitting layer,
wherein forming the thin film encapsulation layer comprises:
forming a first inorganic layer on the substrate on which the organic light emitting diode is formed;
forming an organic layer on the first inorganic layer; and
forming a second inorganic layer on the organic layer,
wherein the first inorganic layer is formed on at least one of the first barrier and the second barrier.

9. The method of claim 8, wherein the first inorganic layer is formed on the first barrier and the second barrier.

10. The method of claim 8, wherein the organic layer is formed inside of the second barrier on the first inorganic layer.

11. The method of claim 8, wherein the organic layer is formed inside of the first barrier on the first inorganic layer.

12. The method of claim 10, wherein the second inorganic layer is formed on the organic layer, the first barrier, and the second barrier.

13. The method of claim 12, wherein the first inorganic layer and the second inorganic layer are formed on the second barrier while in direct contact with one another.

* * * * *